US008446735B2

(12) United States Patent
Yonehara

(10) Patent No.: US 8,446,735 B2
(45) Date of Patent: May 21, 2013

(54) SEMICONDUCTOR PACKAGE

(75) Inventor: Katsuyuki Yonehara, Ichimiyake (JP)

(73) Assignee: International Business Machines Corporation, Armonk, NY (US)

( * ) Notice: Subject to any disclaimer, the term of this patent is extended or adjusted under 35 U.S.C. 154(b) by 199 days.

(21) Appl. No.: 13/097,465

(22) Filed: Apr. 29, 2011

(65) Prior Publication Data

US 2011/0199737 A1 Aug. 18, 2011

(30) Foreign Application Priority Data

Dec. 26, 2008 (JP) ................................. 2008-335177

(51) Int. Cl.
*H05K 7/00* (2006.01)

(52) U.S. Cl.
USPC ........... 361/783; 361/760; 361/777; 361/778; 174/260; 174/261

(58) Field of Classification Search
USPC ................. 361/760, 761, 764, 767, 777, 778, 361/783, 728, 748; 257/E23.079; 174/250, 174/255, 257, 260, 261
See application file for complete search history.

(56) References Cited

U.S. PATENT DOCUMENTS

| | | | | |
|---|---|---|---|---|
| 6,538,336 | B1 * | 3/2003 | Secker et al. | 257/786 |
| 6,992,377 | B2 * | 1/2006 | Zhou et al. | 257/692 |
| 7,049,694 | B2 * | 5/2006 | Zhou et al. | 257/692 |
| 2002/0140112 | A1 * | 10/2002 | Pon | 257/786 |
| 2005/0189643 | A1 * | 9/2005 | Zhou et al. | 257/690 |

| | | | | |
|---|---|---|---|---|
| 2007/0018288 | A1 | 1/2007 | Sutardja | |
| 2007/0018289 | A1 | 1/2007 | Sutardja | |
| 2007/0018292 | A1 | 1/2007 | Sutardja | |
| 2007/0018293 | A1 | 1/2007 | Sutardja | |
| 2007/0018294 | A1 | 1/2007 | Sutardja | |
| 2007/0018305 | A1 | 1/2007 | Sutardja | |
| 2007/0096277 | A1 * | 5/2007 | Sutardja | 257/678 |

FOREIGN PATENT DOCUMENTS

| | | |
|---|---|---|
| CN | 1933134 | 3/2007 |
| CN | 1933135 | 3/2007 |
| CN | 1933138 | 3/2007 |
| EP | 1746648 | 1/2007 |
| EP | 1746649 | 1/2007 |
| EP | 1746650 | 1/2007 |
| JP | 5235245 A | 9/1993 |

(Continued)

OTHER PUBLICATIONS

International Search Report PCT/JP2009/069049, date: Dec. 8, 2009.

*Primary Examiner* — Hoa C Nguyen
(74) *Attorney, Agent, or Firm* — Yuanmin Cai

(57) ABSTRACT

Embodiments of the present invention provide a semiconductor package which includes: a semiconductor chip to which one end of each of a plurality of wires is connected; and a board on which the semiconductor chip is fixed, and a plurality of board wires to which the plurality of corresponding wires are connected are disposed, wherein the board includes: a first wiring pair that includes a first pair of wires in parallel with each other and first two board wires connected to the corresponding wires, one of the wires connected to one of the board wires crossing the other board wire without contact with the other board wire, and a second wiring pair that is provided adjacent to the first wiring pair and includes a second pair of wires in parallel with each other and second two board wires connected to the corresponding wires without a crossing.

7 Claims, 9 Drawing Sheets

FOREIGN PATENT DOCUMENTS

| | | |
|---|---|---|
| JP | 11067970 | 3/1999 |
| JP | 2003068780 | 3/2003 |
| JP | 2005322814 | 11/2005 |
| JP | 2007043146 | 2/2007 |
| JP | 2007059884 | 3/2007 |
| JP | 2007059885 | 3/2007 |
| JP | 92007059884 | 3/2007 |
| JP | 2007525842 | 9/2007 |
| SG | 129383 | 2/2007 |
| SG | 129384 | 2/2007 |
| SG | 129385 | 2/2007 |

\* cited by examiner

FIG. 1
(a)
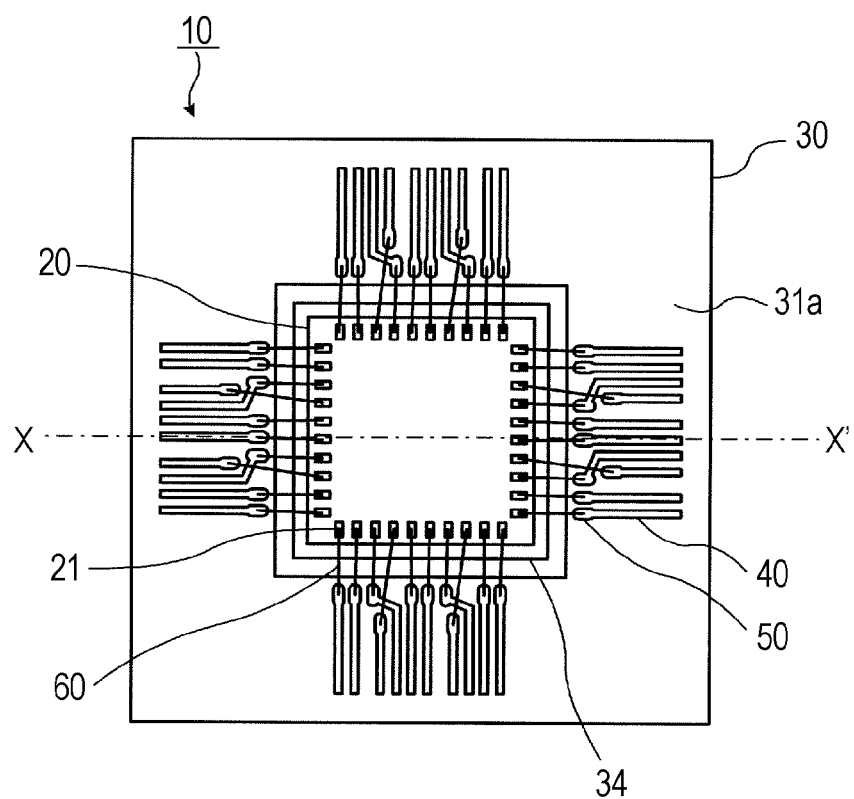
(b)
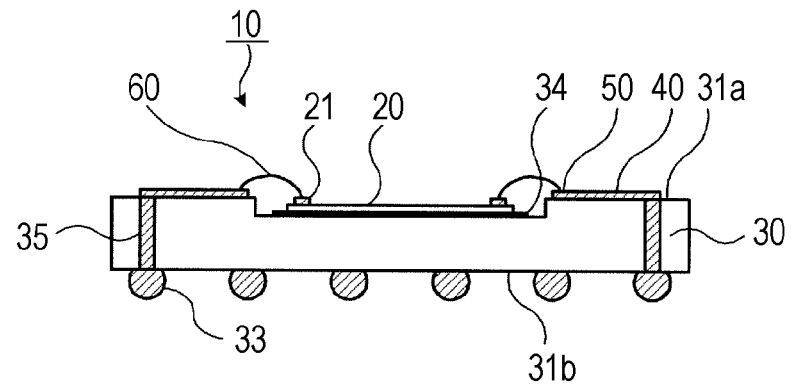

FIG. 9

| | EXAMPLE | COMPARATIVE EXAMPLE 1 | COMPARATIVE EXAMPLE 2 |
|---|---|---|---|
| CHIP PAD (THREE WIRING PAIRS) | 60 μm × 6 | 60 μm × 6 | 60 μm × 6 |
| BOND PAD (THREE WIRING PAIRS) | 110 μm × 5 + 110 μm | 110 μm × 6 | 110 μm × 6 + 80 μm × 3 |
| BOARD WIRE WIDTH (THREE WIRING PAIRS) | 660 μm | 660 μm | 900 μm |
| AMOUNT OF NEAR END CROSSTALK | −43 dB @ 1.5 GHz | −32 dB @ 1.5 GHz | −41 dB @ 1.5 GHz |
| AMOUNT OF FAR END CROSSTALK | −54 dB @ 1.5 GHz | −52 dB @ 1.5 GHz | −69 dB @ 1.5 GHz |

SEMICONDUCTOR PACKAGE

TECHNICAL FIELD

The present invention relates to a semiconductor package including a semiconductor chip.

BACKGROUND

The speed of data processing and data transmission in devices in which semiconductors are used, for example, computers, is rapidly increasing. A speedup in these devices absolutely requires a speedup in data processing and data transmission in semiconductor chips. Moreover, it is important to increase the speed of data transmission in semiconductor packages including semiconductor chips.

When the frequency of input and output signals of a semiconductor chip has exceeded 1 GHz, normal signal transmission cannot be performed due to an increase in the influence of interference between electrical signals transmitted through thin metal wires each of which electrically connects an electrode of a semiconductor chip to a lead part of a lead frame. Patent Literature 1 (Japanese Unexamined Patent Application Publication No. 2003-68780) describes a technique for reducing the mutual inductance between signals transmitted through thin metal wires and suppressing occurrence of crosstalk by crossing the thin metal wires.

Moreover, Patent Literature 2 (Japanese Unexamined Patent Application Publication No. 2007-525842) describes a technique for reducing the self inductance of bond wires by crossing the bond wires at multiple points so as to suppress changes in the operation of a circuit due to changes in the electrical characteristics of signal paths caused by the self inductance of the bond wires and traces in a semiconductor package.

Recently, differential signaling has been used for rapid transmission of signals to and from a semiconductor chip. Differential signaling is signaling for binding two signal lines together into a pair (signal line pair) and detecting the potential difference between the signal lines. In differential signaling, a signal in one of the two signal lines is set as a complementary signal to a signal in the other signal line, and the difference between the signal lines is taken. Thus, noise superimposed on the two signal lines with the same polarity can be canceled.

On the other hand, in Peripheral Component Interconnect (PCI) Express, a bus standard for communications between processors and peripherals, a data transfer rate of 2.5 Gbps in one direction and a data transfer rate of 5.0 Gbps in two directions are supported. Input and output signals of a semiconductor chip need to have a frequency (signal frequency) ranging from 1.5 to 3 GHz to implement these data transfer rates. Moreover, in PCI Express Generation 2, a standard next to PCI express, a further increase in the signal frequency is required.

In the case of such high frequency signal transmission, even when differential signaling is used, signals transmitted through a signal line pair will suffer from the influence (crosstalk) of leakage of signals from an adjacent signal line pair. Then, a problem such that normal signal transmission cannot be performed due to the occurrence of jitter and the like will arise.

Thus, an amount of crosstalk of −30 dB or less is considered to be necessary in a signal frequency range of 1 to 3 GHz to avoid the influence of an adjacent signal line pair.

Methods for solving this problem include a method for providing wiring lines for shielding (shielding wires) between a signal line pair and an adjacent signal line pair. However, in this method, since shielding wires, together with wiring lines for signals, are provided on a board of a semiconductor package, the wiring pitch is increased, and thus, the density of wiring lines is decreased. That is, the density of wiring lines on a board of a semiconductor package cannot be increased. Thus, the method for providing shielding wires has a problem in that the method cannot adapt to an increase in the number of pins and a reduction in the pitch in input and output signal terminals of a semiconductor chip.

SUMMARY OF EMBODIMENTS

It is an object of the present invention to provide a semiconductor package in which signal degradation is reduced without decreasing the density of wiring on a board of the semiconductor package.

A semiconductor package to which the present invention is applied includes a semiconductor chip to which one end of each of a plurality of wires is connected, and a board on which the semiconductor chip is fixed, and a plurality of board wires to which the plurality of corresponding wires are connected are disposed. The board includes a first wiring pair that includes a first pair of wires in parallel with each other and first two board wires connected to the corresponding wires, one of the wires connected to one of the board wires crossing the other board wire without contact with the other board wire, and a second wiring pair that is provided adjacent to the first wiring pair and includes a second pair of wires in parallel with each other and second two board wires connected to the corresponding wires without a crossing.

In the first wiring pair, a wire terminal connected to one of the wires and a wire terminal connected to the other wire may be disposed so as to be shifted from each other at respective different distances from an edge of the semiconductor chip in a direction of the wires.

A plurality of the wires of the semiconductor chip may not cross each other.

The first wiring pair and the second wiring pair may transmit differential signals. Differential signals transmitted by the first wiring pair and the second wiring pair may have a frequency in a range of 1 to 3 GHz.

Regarding an area between one wire of the first pair of wires, one board wire of the first two board wires connected to the one wire, the other wire of the first pair of wires, and the other board wire of the first two board wires connected to the other wire, a ratio between two portions of the area may be set equal to or more than 0.5 and equal to or less than 2. The area is divided into the two portions by a perpendicular onto the board with a foot of the perpendicular at a point at which a projection of the one wire connected to the one board wire upon the board crosses the other board wire.

In the first wiring pair and the second wiring pair provided adjacent to the first wiring pair, a ratio between a first capacitance and a second capacitance may be equal to or more than 0.5 and equal to or less than 2. The first capacitance exists between a first portion of a wiring line constituting the first wiring pair, the first portion opposing the second wiring pair on a board wire side, and a second portion of a wiring line constituting the second wiring pair, the second portion being on the board wire side and opposing the first portion. The second capacitance exists between a third portion of a wiring line constituting the first wiring pair, the third portion opposing the second wiring pair on a wire side, and a fourth portion of the wiring line constituting the second wiring pair, the fourth portion being on the wire side and opposing the third portion.

From another viewpoint, a semiconductor package to which the present invention is applied includes a semiconductor chip, a board on which the semiconductor chip is fixed, and signal lines each of which includes a wire one end of which is connected to the semiconductor chip and a wiring line that is disposed on the board and connected to the other end of the wire. The signal lines constitute signal line pairs transmitting differential signals. A first signal line pair in which signal lines cross each other and a second signal line pair in which signal line do not cross each other are disposed, as the signal line pairs, adjacent to each other so as to cancel signals leaked due to electromagnetic coupling and capacitive coupling between the signal line pairs.

In the first signal line pair and the second signal line pair provided adjacent to the first signal line pair, a ratio between a first capacitance and a second capacitance may be equal to or more than 0.5 and equal to or less than 2. The first capacitance exists between a first portion of a signal line constituting the first signal line pair, the first portion opposing the second signal line pair on a wiring line side, and a second portion of a signal line constituting the second signal line pair, the second portion being on the wiring line side and opposing the first portion. The second capacitance exists between a third portion of a signal line constituting the first signal line pair, the third portion opposing the second signal line pair on a wire side, and a fourth portion of the signal line constituting the second signal line pair, the fourth portion being on the wire side and opposing the third portion.

The present invention provides means for canceling the interaction (electromagnetic coupling and capacitive coupling) between differential signals in a wire portion and a board wire portion by interchanging wiring lines for differential signals in the wire portion and the board wire portion and enabling small-pitch wiring.

BRIEF DESCRIPTION OF DRAWINGS

FIG. 1 is a diagram showing a semiconductor package according to an embodiment.

FIG. 9 is an illustration showing the amount of near end crosstalk and the amount of far end crosstalk in each of an example, the comparative example 1, and the comparative example 2.

DETAILED DESCRIPTION OF EMBODIMENTS

Figure 2:
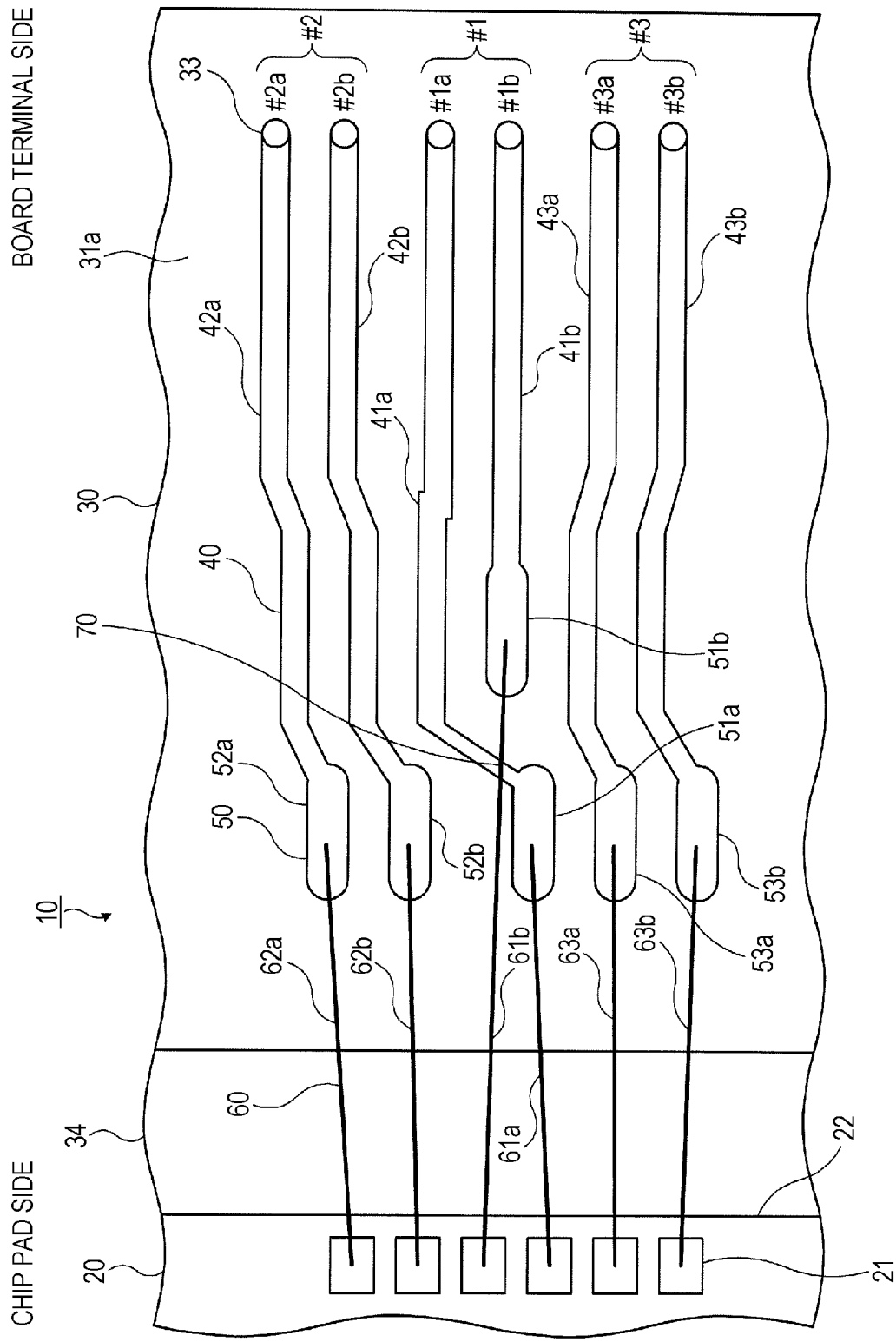
FIG. 2 is a magnified plan view of a portion of the semiconductor package according to the embodiment.

An embodiment of the present invention will now be described in detail referring to the attached drawings. The same signs are assigned to the same components, and duplicate description is omitted. Moreover, the attached drawings schematically describe the embodiment of the present invention and thus are not drawn to scale.

FIG. 1 is a diagram showing a semiconductor package 10 according to the embodiment. FIG. 1(a) is a plan view of the semiconductor package 10, and FIG. 1(b) is a sectional view of the semiconductor package 10 taken along the line X-X' of FIG. 1(a).

The semiconductor package 10 includes a semiconductor chip 20 in which an integrated circuit is formed and a circuit board 30 on which the semiconductor chip 20 is mounted as an exemplary board. The circuit board 30 is a Ball Grid Array (BGA) board as an example.

The semiconductor chip 20 is an integrated circuit formed on a semiconductor board composed of, for example, Si. A plurality of chip pads 21 are provided on a surface of the semiconductor chip 20 along edges of the semiconductor chip 20. Each of the chip pads 21 is formed of a metal film of, for example, Al and is a square region with a side of several tens of micrometers. The chip pads 21 are disposed with a pitch of, for example, 60 μm therebetween.

Moreover, the chip pads 21 are terminals for inputting and outputting signals from and to an integrated circuit formed in the semiconductor chip 20 and supplying power to the semiconductor chip 20.

The circuit board 30 is a planar board composed of, for example, ceramic. A plurality of board wires 40 composed of, for example, Ag paste and bond pads 50 as exemplary wire terminals are formed on a surface 31a of the circuit board 30. Each of the bond pads 50 is formed at one end of a corresponding one of the board wires 40.

On the other hand, terminals (board terminals) 33 of solder balls for inputting and outputting signals from and to the semiconductor package 10 are formed on a back surface 31b of the circuit board 30. Via conductors (metal wires filling through holes) 35 connecting the board terminals 33 to the board wires 40 are formed in the circuit board 30.

Moreover, a ground plate 34 formed in a manner similar to that in which the board wires 40 are formed is provided on the surface 31a of the circuit board 30. The semiconductor chip 20 is fixed on the ground plate 34 with, for example, a conductive adhesive. The ground potential is supplied to the semiconductor chip 20 via the ground plate 34.

The semiconductor package 10 may be protected by injecting resin into portions of the semiconductor chip 20, the board wires 40, the bond pads 50, and wires 60 and curing the resin.

The semiconductor package 10 further includes a plurality of the wires 60 connecting the chip pads 21 provided on the semiconductor chip 20 to the board wires 40 (specifically, the bond pads 50) provided on the circuit board 30.

The wires 60 are, for example, Au thin wires. One end of each of the wires 60 is connected to a corresponding one of the chip pads 21 by thermo-compression bonding. On the other hand, similarly, the other end of the wire 60 is connected to one of the bond pads 50 predetermined for the chip pad 21. The both ends of the wire 60 are fixed, and the other portion is stretched in the air in the shape of an arc.

Since the wires 60 are not covered with insulation, when the wires 60 come into contact with each other, a short circuit occurs. Thus, the wires 60 are disposed so as not to cross each other. In this case, the length of each of the wires 60, the distance between the wire 60 and the adjacent wire 60, the tension, and the like are set so that the wires 60 do not come into contact with each other.

In the embodiment, first wiring pairs (signal line pairs) and second wiring pairs (signal line pairs) are alternately disposed. Each of the first wiring pairs includes a pair of two of the wires 60 in parallel with each other and two of the board wires 40 connected to the wires 60. In the first pair, one of the wires 60 connected to one of the board wires 40 crosses the other board wire 40 without contact with the other board wire 40. Each of the second wiring pairs includes a pair of two of the wires 60 in parallel with each other and two of the board wires 40 connected to the wires 60 without a crossing. The respective configurations of these wiring pairs will be described below in detail.

The semiconductor package 10 is fixed to a laminated circuit board (not shown) of, for example, glass epoxy in which wiring lines are formed using a Cu foil by melting the solder balls with heat. The semiconductor package 10 performs data processing and the like on the basis of power and signals supplied from the laminated circuit board.

FIG. 2 is a magnified plan view of a portion of the semiconductor package 10 according to the embodiment.

FIG. 2 shows three signal line pairs (#1 to #3) as exemplary wiring pairs in each of which a corresponding one of the chip pads 21 of the semiconductor chip 20 is connected to a corresponding one of the bond pads 50 of the board wires 40 by a corresponding one of the wires 60. The signal line pair #1 includes signal lines #1a and #1b. Moreover, the signal line pair #2 includes signal lines #2a and #2b. Similarly, the signal line pair #3 includes signal lines #3a and #3b.

Each of the signal line pairs #1 to #3 transmits differential signals.

In this case, a signal line represents a portion extending from a corresponding one of the chip pads 21 to a corresponding one of the board terminals 33. That is, a signal line includes a corresponding one of the chip pads 21, a corresponding one of the wires 60 one end of which is connected to the chip pad 21, a corresponding one of the bond pads 50 to which the other end of the wire 60 is connected, a corresponding one of the board wires 40 connected to the bond pad 50, and a corresponding one of the board terminals 33 connected to the board wire 40. In this case, the board terminals 33 are provided on the back surface 31b of the circuit board 30, but are shown on the surface 31a of the circuit board 30, the board terminals 33 being connected to the board wires 40, for the sake of convenience.

A side near the board terminal 33 of a signal line is called a board terminal side, and a side near the chip pad 21 of the signal line is called a chip pad side.

The signal line pair #1 includes the signal lines #1a and #1b. The signal line #1a includes a board wire 41a and a wire 61a. In this case, when the board wire 40 of the signal line #1a needs to be distinguished, the board wire 40 is called the board wire 41a, and the wire 60 is called the wire 61a. Similarly, the bond pad 50 of the signal line #1a is called a bond pad 51a. The same applies to the other signal line.

The signal line #1b includes a board wire 41b and a wire 61b. That is, the signal line pair #1 includes the wires 61a and 61b as an exemplary first pair of wires and the board wires 41a and 41b as exemplary first two board wires respectively connected to the first pair of wires 61a and 61b.

The signal line #1a and the signal line #1b are set so that the board wire 41a and the wire 61b cross each other at a crossing 70. However, the wire 61b is stretched in the air, as described in FIG. 1. Thus, the board wire 41a and the wire 61b do not come into contact with each other. That is, the board wire 41a and the wire 61b three-dimensionally cross each other.

Moreover, the bond pad 51b, which is a wire terminal connected to the wire 61b, is disposed on the board terminal side, as viewed from the bond pad 51a, which is a terminal connected to the wire 61a, i.e., at a position shifted to the direction of the wires 60. In other words, the bond pads 51b and 51a are disposed at respective different distances from an edge 22 of the semiconductor chip 20. The board wire 41a is formed so as to round the bond pad 51b, and the bond pad 51a is formed at the end of the board wire 41a.

In this arrangement, the signal lines #1a and #1b are set to cross each other on the surface 31a of the circuit board 30 by three-dimensionally crossing the board wire 41a and the wire 61b. The wires 61a and 61b do not cross each other.

The signal line pairs #2 and #3 are provided on the both sides of the signal line pair #1.

The signal line pair #2 includes the signal lines #2a and #2b. The signal line #2a includes a board wire 42a, a bond pad 52a connected to the board wire 42a, and a wire 62a connecting the bond pad 52a to a corresponding one of the chip pads 21. The signal line #2b includes a board wire 42b, a bond pad 52b connected to the board wire 42b, and a wire 62b connecting the bond pad 52b to a corresponding one of the chip pads 21. The signal lines #2a and #2b in the signal line pair #2 are set so as not to cross each other. In this case, the bond pads 52a and 52b are disposed at substantially the same distance from the edge 22 of the semiconductor chip 20.

That is, the signal line pair #2 includes the wires 62a and 62b as an exemplary second pair of wires and the board wires 42a and 42b as exemplary second two board wires respectively connected to the second pair of wires 62a and 62b.

Similarly, the signal line pair #3 includes the signal lines #3a and #3b. The signal line #3a includes a board wire 43a, a bond pad 53a connected to the board wire 43a, and a wire 63a connecting the bond pad 53a to a corresponding one of the chip pads 21. The signal line #3b includes a board wire 43b, a bond pad 53b connected to the board wire 43b, and a wire 63b connecting the bond pad 53b to a corresponding one of the chip pads 21. The signal lines #3a and #3b in the signal line pair #3 are set so as not to cross each other. That is, the configuration of the signal line pair #3 is similar to that of the signal line pair #2.

Although not shown in FIG. 2, a first signal line pair, similar to the signal line pair #1, in which signal lines cross each other is disposed adjacent to the signal line pair #3 (on a side opposite the signal line pair #1), and a second signal line pair, similar to the signal line pair #2, in which signal lines do not cross each other is disposed adjacent to the first signal line pair.

In the embodiment, signal line pairs in each of which signal lines cross each other and signal line pairs in each of which signal lines do not cross each other are alternately disposed, as shown in FIG. 1(a).

A reduction in signal degradation in the semiconductor package 10 according to the embodiment shown in FIG. 2 will next be described.

Signal degradation occurs due to the leakage of signals from a pair of adjacent signal lines, i.e., crosstalk. The crosstalk includes two types of:

(1) Crosstalk due to electromagnetic coupling
(2) Crosstalk due to capacitive coupling Assuming that signal lines A and B are disposed in parallel with each other, crosstalk due to coupling between the two will next be described.

A magnetic field is generated by signals (current) passing through the signal line B. In this case, the leakage of signals due to a current induced in the signal line A due to temporal variations in the magnetic field (temporal variations in a magnetic flux) is called crosstalk due to electromagnetic coupling. A phenomenon in which a current is generated due to temporal variations in a magnetic flux is called electromagnetic induction.

On the other hand, crosstalk due to capacitive coupling represents signal leakage due to the leakage of some signals in the signal line B into the signal line A via a capacitance (parasitic capacitance) between the two signal lines A and B.

In the embodiment, the aforementioned two types of crosstalk can be reduced.

It will first be qualitatively described that crosstalk due to electromagnetic coupling can be reduced in the embodiment.

Figure 3:
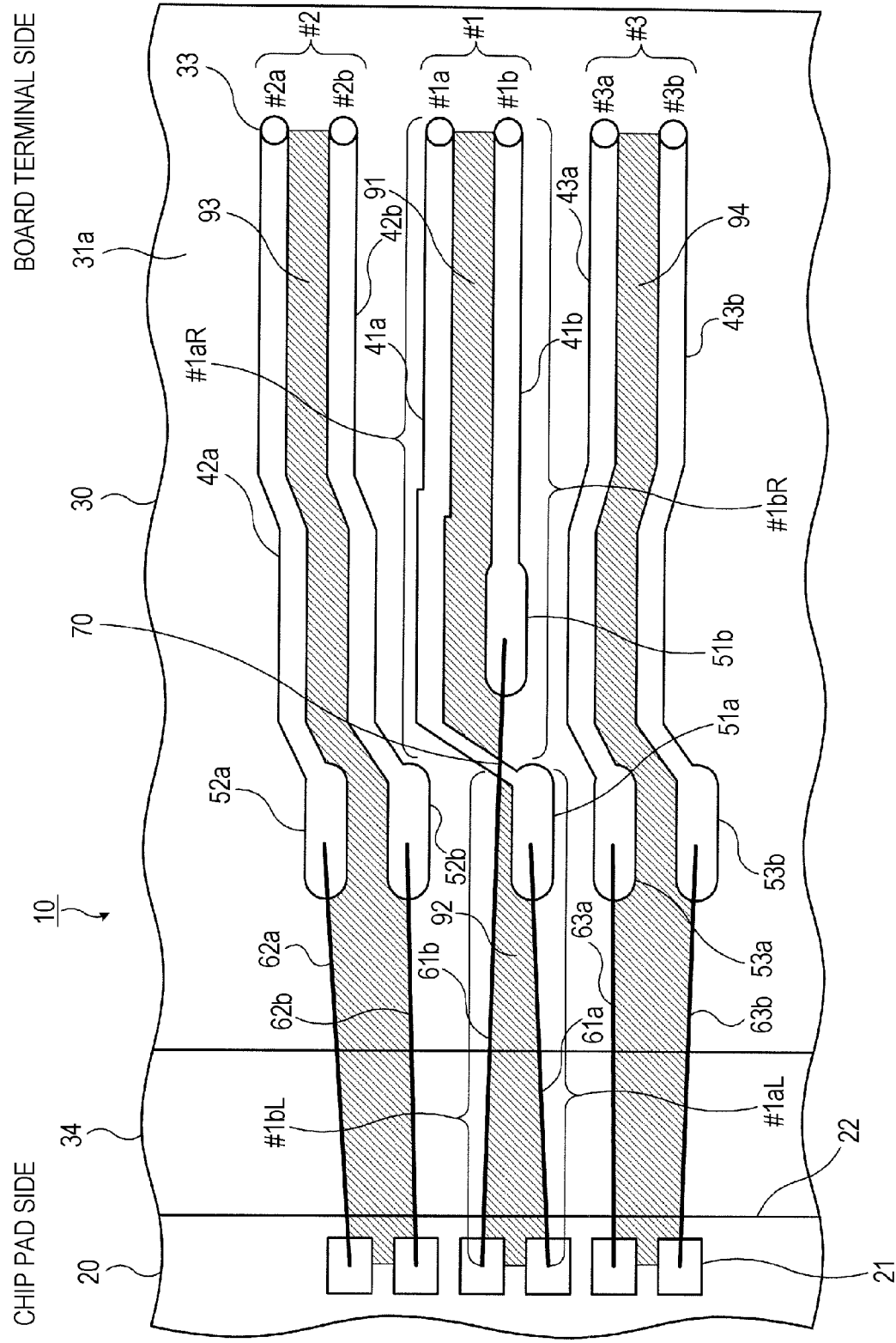
FIG. 3 is a magnified plan view of a portion of the semiconductor package for describing electromagnetic coupling between signal line pairs #1 to #3.

FIG. 3 is a magnified plan view of a portion of the semiconductor package 10 for describing electromagnetic coupling between the signal line pairs #1 to #3.

FIG. 3 shows the signal lines #1a and #1b projected to the surface of the circuit board 30. In the magnified plan view of FIG. 3, each of the signal lines #1a and #1b is divided into two portions at the point (crossing) 70 at which the board wire 41a crosses the wire 61b. Actually, each of the signal lines #1a and #1b is divided at a point at which each of the signal lines #1a and #1b crosses a perpendicular dropped from the crossing 70 to the surface of the circuit board 30. That is, in the magnified plan view of FIG. 3, the signal line #1a includes a board-wire-portion signal line #1aR on the board terminal side as viewed from the crossing 70 and a wire-portion signal line #1aL on the chip pad side as viewed from the crossing 70. Similarly, in the magnified plan view of FIG. 3, the signal line #1b includes a board-wire-portion signal line #1bR on the board terminal side as viewed from the crossing 70 and a wire-portion signal line #1bL on the chip pad side as viewed from the crossing 70.

The effects of the signal line pairs #2 and #3 on the signal line pair #1 will first be described.

A magnetic field generated by the signal line pair #2 will first be described. When signals are transmitted through the signal line #2a, a magnetic field is generated around the signal line #2a. Similarly, when signals are transmitted through the signal line #2b, a magnetic field is generated around the signal line #2b.

The signal line pair #2 transmits differential signals, as described above. The respective directions of magnetic fields generated by the signal lines #2a and #2b are opposite each other. Thus, in a region outside the signal line pair #2, i.e., a region other than a region 93 between the signal lines #2a and #2b shown in FIG. 3, since the respective directions of the magnetic fields generated by the signal lines #2a and #2b are opposite each other, the magnetic fields cancel each other. However, in the region 93 between the signal lines #2a and #2b, the respective directions of the magnetic fields generated by the signal lines #2a and #2b are the same. Thus, when the effects of the signal line pair #2 on the other signal line pairs are considered, only a magnetic flux passing through the region 93 needs to be considered.

The effects of the magnetic flux generated from the signal line pair #2 and passing through the region 93 on the signal line pair #1 will next be considered.

When the magnetic flux generated from the signal line pair #2 and passing through the region 93 passes by the signal lines #1a and #1b, currents are generated in the signal lines #1a and #1b. However, in the signal lines #1a and #1b, the respective directions of currents generated by a magnetic flux passing through a region outside the signal line pair #1, i.e., a region other than a region 91 between the board-wire-portion signal lines #1aR and #1bR and a region 92 between the wire-portion signal lines #1aL and #1bL in FIG. 3, are the same. In this case, differential signals are transmitted through the signal lines #1a and #1b. Thus, a signal of the signal line pair #1 is the difference between respective signals of the signal lines #1a and #1b. Thus, signals leaked due to currents generated by a magnetic flux passing through the region 91 and the region 92 will cancel each other.

Respective currents generated in the signal lines #1a and #1b by the magnetic flux generated from the signal line pair #2 and having passed through the region 93 passing through the regions 91 and 92 will be a problem. In this case, the respective directions of the currents generated in the signal lines #1a and #1b are opposite each other. Thus, it is considered that crosstalk will occur in the signal line pair #1 due to signals leaked due to the currents generated in the signal lines #1a and #1b.

However, in the embodiment, the signal lines #1a and #1b cross each other at the crossing 70, as shown in FIG. 3. Thus, even when the magnetic flux generated from the signal line pair #2 and having passed through the region 93 passes through the region 91 and the region 92, the respective directions of currents generated by the magnetic flux in the board-wire-portion signal line #1aR and the wire-portion signal line #1aL, which are portions of the signal line #1a, are opposite each other. Thus, signals leaked due to these currents cancel each other, and no crosstalk occurs in the signal line #1a.

The same applies to the board-wire-portion signal line #1bR and the wire-portion signal line #1bL, which are portions of the signal line #1b.

Thus, crosstalk from the signal line pair #2 to the signal line pair #1 due to electromagnetic coupling can be reduced.

Similarly, crosstalk from the signal line pair #3 to the signal line pair #1 due to electromagnetic coupling can be reduced.

When the area of the region 91 between the board-wire-portion signal lines #1aR and #1bR is the same as the area of the region 92 between the wire-portion signal lines #1aL and #1bL, the respective amounts of currents generated in the board-wire-portion signal line #1aR and the wire-portion signal line #1aL are substantially the same, and thus crosstalk can be further reduced.

When the ratio of the area of the region 91 to the area of the region 92 is equal to or more than 0.5 and equal to or less than 2, at least, crosstalk can be reduced by a factor of three or more.

The effects of the signal line pair #1 on the signal line pair #2 or #3 will next be described.

A magnetic field generated by the signal line pair #1 will first be described. When signals pass through the signal line #1a, a magnetic field is generated around the signal line #1a. Similarly, when signals pass through the signal line #1b, a magnetic field is generated around the signal line #1b.

Since the signal line pair #1 transmits differential signals, only a magnetic flux passing through the regions 91 and 92 between the signal lines #1a and #1b needs to be considered, as described above.

The signal lines #1a and #1b cross each other at the crossing 70. Thus, the respective directions of the magnetic flux passing through the region 91 and the region 92 are opposite each other.

The effects of the magnetic flux generated from the signal line pair #1 and passing through the region 91 and the region 92 on the signal line pair #2 will next be considered.

Even in the case of the signal line pair #2, only the magnetic flux generated from the signal line pair #1, having passed through the region 91 and the region 92, and then passing through the region 93 needs to be considered, as described above.

The respective directions of the magnetic flux having passed through the region 91 and the magnetic flux having passed through the region 92 are opposite each other. Thus, the respective directions of a current generated in the signal line #2a by the magnetic flux having passed through the region 91 and a current generated in the signal line #2a by the magnetic flux having passed through the region 92 are opposite each other. Thus, signals leaked due to these currents cancel each other. Similarly, the respective directions of a current generated in the signal line #2b by the magnetic flux having passed through the region 91 and a current generated in the signal line #2b by the magnetic flux having passed through the region 92 are opposite each other, and thus, signals leaked due to these currents cancel each other.

Thus, crosstalk from the signal line pair #1 to the signal line pair #2 due to electromagnetic coupling can be reduced.

Similarly, crosstalk from the signal line pair #1 to the signal line pair #3 due to electromagnetic coupling can be reduced.

When the area of the region 91 between the board-wire-portion signal lines #1aR and #1bR is the same as the area of the region 92 between the wire-portion signal lines #1aL and #1bL, the respective amounts of a current generated in the signal line #2a by the magnetic flux having passed through the region 91 and a current generated in the signal line #2a by the magnetic flux having passed through the region 92 are substantially the same, and thus, crosstalk can be further reduced.

When the ratio of the area of the region 91 to the area of the region 92 is equal to or more than 0.5 and equal to or less than 2, at least, crosstalk can be reduced by a factor of three or more.

In the embodiment, since the signal line pair #1, in which signal lines are disposed so as to cross each other, is provided, and the signal line pairs #2 and #3, in each of which signal lines are disposed so as not to cross each other, are provided on the both sides of the signal line pair #1, signal degradation (crosstalk) due to signals leaked due to electromagnetic coupling between the signal line pairs #1 to #3 can be reduced, as described above.

That is, in order to reduce crosstalk due to electromagnetic coupling, it is preferable that signal line pairs in each of which signal lines are disposed so as to cross each other and signal line pairs in each of which signal lines are disposed so as not to cross each other be disposed alternately.

It will next be described that signal degradation due to capacitive coupling can be reduced in the embodiment.

Figure 4:
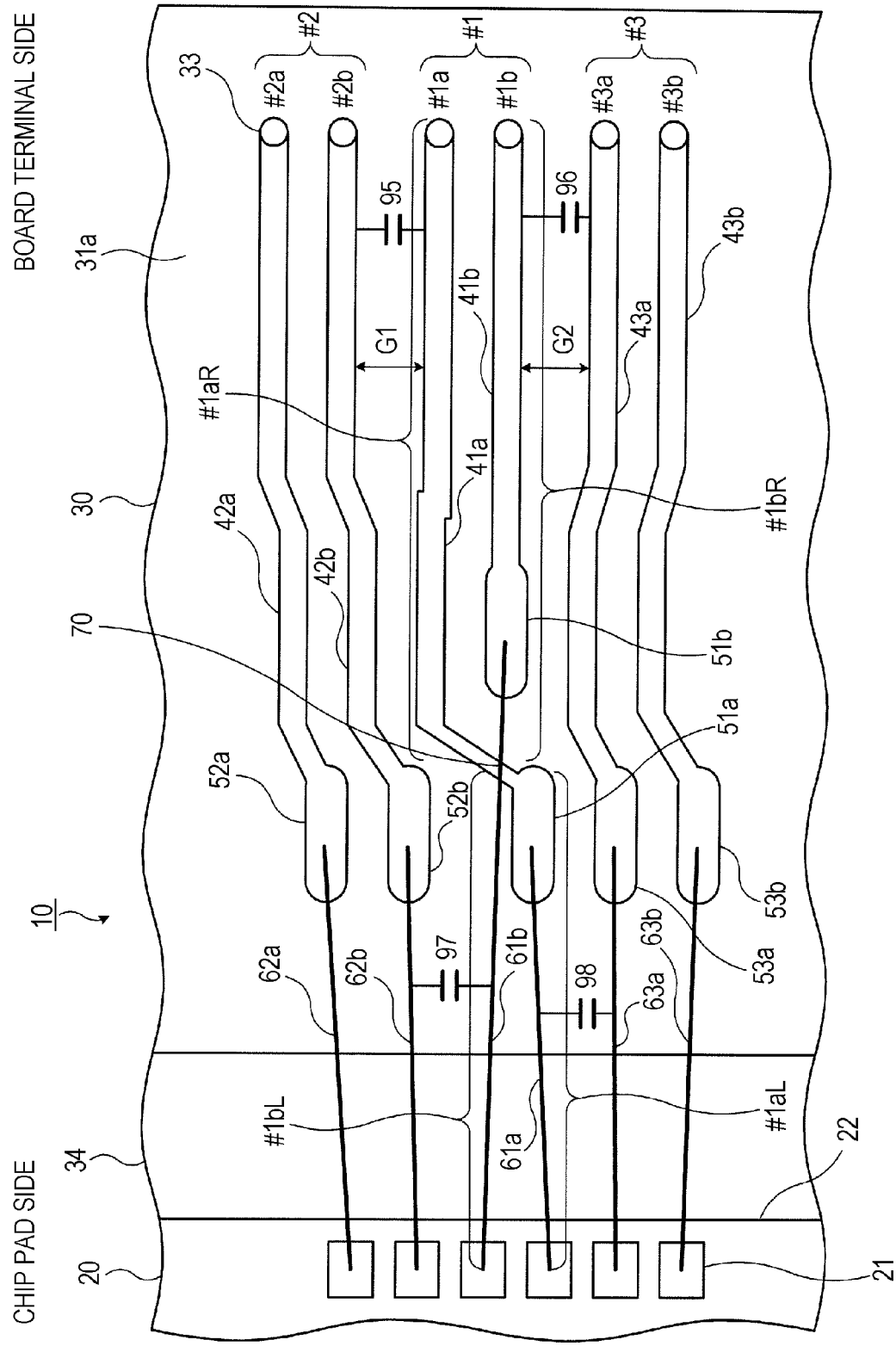
FIG. 4 is a magnified plan view of a portion of the semiconductor package for describing capacitive coupling between the signal line pairs #1 to #3.

FIG. 4 is a magnified plan view of a portion of the semiconductor package 10 for describing capacitive coupling between the signal line pairs #1 to #3.

In the magnified plan view of FIG. 4, each of the signal lines #1a and #1b is divided into two portions at the point (crossing) 70 at which the board wire 41a crosses the wire 61b. That is, the signal line #1a includes the board-wire-portion signal line #1aR and the wire-portion signal line #1aL. Similarly, the signal line #1b includes the board-wire-portion signal line #1bR and the wire-portion signal line #1bL.

The effects of the signal line pair #2 on the signal line pair #1 will first be considered. In this case, in the signal line pair #2, only the signal line #2b needs to be considered. This is because, since the signal line #2b is located between the signal line pair #1 and the signal line #2a, and the signal line #2a is electrostatically shielded by the signal line #2b, the signal line #2a does not affect the signal line pair #1.

A board-wire-portion capacitance 95 as an exemplary first capacitance occurs between the signal line pair #1 and the signal line #2b, specifically, between the board-wire-portion signal line #1aR and a portion of the signal line #2b opposing the board-wire-portion signal line #1aR. Moreover, a wire-portion capacitance 97 as an exemplary second capacitance occurs between the wire-portion signal line #1bL and a portion of the signal line #2b opposing the wire-portion signal line #1bL.

When signals pass through the signal line #2b, some of the signals are leaked to the signal line #1a via the board-wire-portion capacitance 95. Moreover, when signals pass through the signal line #2b, some of the signals are leaked to the signal line #1b via the wire-portion capacitance 97.

The signal line pair #1 transmits differential signals. Since a signal of the signal line pair #1 is the difference between respective signals of the signal lines #1a and #1b, the difference between some signals of the signal line #2b leaked to the signal line #1a via the board-wire-portion capacitance 95 and some signals of the signal line #2b leaked to the signal line #1b via the wire-portion capacitance 97 is superimposed on signals of the signal line pair #1.

When the board-wire-portion capacitance 95 is equal to the wire-portion capacitance 97, some signals of the signal line #2b leaked to the signal line #1a via the board-wire-portion capacitance 95 are equal to some signals of the signal line #2b leaked to the signal line #1b via the wire-portion capacitance 97. Thus, crosstalk from the signal line #2b does not occur in signals of the signal line pair #1.

When the ratio of the board-wire-portion capacitance 95 to the wire-portion capacitance 97 is equal to or more than 0.5 and equal to or less than 2, at least, crosstalk can be reduced by a factor of three or more.

Similarly, the effects of the signal line pair #3 on the signal line pair #1 will be considered. In the signal line pair #3, only the signal line #3a needs to be considered. A board-wire-portion capacitance 96 occurs between the signal line pair #1 and the signal line #3a, specifically, between the board-wire-portion signal line #1bR and a portion of the signal line #3a opposing the board-wire-portion signal line #1bR. Moreover, a wire-portion capacitance 98 occurs between the wire-portion signal line #1aL and a portion of the signal line #3a opposing the wire-portion signal line #1aL.

When signals pass through the signal line #3a, some of the signals are leaked to the signal line #1b via the board-wire-portion capacitance 96. Moreover, when signals pass through the signal line #3a, some of the signals are leaked to the signal line #1a via the wire-portion capacitance 98.

Since the signal line pair #1 transmits differential signals, the difference between some signals of the signal line #3a leaked to the signal line #1b via the board-wire-portion capacitance 96 and some signals of the signal line #3a leaked to the signal line #1a via the wire-portion capacitance 98 is superimposed on signals of the signal line pair #1.

When the board-wire-portion capacitance 96 is equal to the wire-portion capacitance 98, some signals of the signal line #3a leaked to the signal line #1b via the board-wire-portion capacitance 96 are equal to some signals of the signal line #3a leaked to the signal line #1a via the wire-portion capacitance 98. Thus, crosstalk from the signal line #3a does not occur in signals of the signal line pair #1.

When the ratio of the board-wire-portion capacitance 96 to the wire-portion capacitance 98 is equal to or more than 0.5 and equal to or less than 2, at least, crosstalk can be reduced by a factor of three or more.

The effects of adjacent signal lines due to capacitive coupling can be made less prone to occur in signals of a signal line pair in which signal lines are disposed so as to cross each other, as described above.

On the other hand, the effects of the signal line pair #1 on the signal line pair #2 will be considered. The relationships between the signal line #2b of the signal line pair #2 and the board-wire-portion signal line #1aR and the wire-portion signal line #1bL of the signal line pair #1 need to be considered. The capacitances between these signal lines are described above.

When signals pass through the signal line pair #1, some signals of the signal line #1a are leaked to the signal line #2b via the board-wire-portion capacitance 95. Similarly, when signals pass through the signal line pair #1, some signals of the signal line #1b are leaked to the signal line #2b via the wire-portion capacitance 97.

Differential signals are transmitted through the signal lines #1a and #1b. Thus, the sign of a signal of the signal line #1a leaked to the signal line #2b via the board-wire-portion capacitance 95 is opposite the sign of a signal of the signal line #1b leaked to the signal line #2b via the wire-portion capacitance 97. Thus, these signals cancel each other.

When the board-wire-portion capacitance 95 is equal to the wire-portion capacitance 97, the absolute value of a signal of the signal line #1a leaked to the signal line #2b via the board-wire-portion capacitance 95 is equal to the absolute value of a signal of the signal line #1b leaked to the signal line #2b via the wire-portion capacitance 97. Thus, the effects of crosstalk from the signal line pair #1 do not occur in signals of the signal line #2b.

When the ratio of the board-wire-portion capacitance 95 to the wire-portion capacitance 97 is equal to or more than 0.5 and equal to or less than 2, at least, crosstalk can be reduced by a factor of three or more.

Similarly, the effects of the signal line pair #1 on the signal line pair #3 will be considered. The relationships between the signal line #3a of the signal line pair #3 and the board-wire-portion signal line #1bR and the wire-portion signal line #1aL of the signal line pair #1 need to be considered. The capacitances between these signal lines are described above.

When signals pass through the signal line pair #1, some signals of the signal line #1b are leaked to the signal line #3a via the board-wire-portion capacitance 96. Similarly, when signals pass through the signal line pair #1, some signals of the signal line #1a are leaked to the signal line #3a via the wire-portion capacitance 98.

Differential signals are transmitted through the signal lines #1a and #1b. Thus, the sign of a signal of the signal line #1b leaked to the signal line #3a via the board-wire-portion capacitance 96 is opposite the sign of a signal of the signal line #1a leaked to the signal line #3a via the wire-portion capacitance 98. Thus, these signals cancel each other.

When the board-wire-portion capacitance 96 is equal to the wire-portion capacitance 98, some signals of the signal line #1b leaked to the signal line #3a via the board-wire-portion capacitance 96 are equal to some signals of the signal line #1a leaked to the signal line #3a via the wire-portion capacitance 98. Thus, the effects of crosstalk from the signal line pair #1 do not occur in signals of the signal line #3a.

When the ratio of the board-wire-portion capacitance 96 to the wire-portion capacitance 98 is equal to or more than 0.5 and equal to or less than 2, at least, crosstalk can be reduced by a factor of three or more.

In the embodiment, since the signal line pair #1, in which signal lines are disposed so as to cross each other, is provided, and the signal line pairs #2 and #3, in each of which signal lines are disposed so as not to cross each other, are provided on the both sides of the signal line pair #1, signal degradation (crosstalk) due to signals leaked due to capacitive coupling between the signal line pairs #1 to #3 can be reduced, as described above.

That is, in order to reduce crosstalk due to capacitive coupling, it is preferable that signal line pairs in each of which signal lines are disposed so as to cross each other and signal line pairs in each of which signal lines are disposed so as not to cross each other be disposed alternately.

Figure 5:
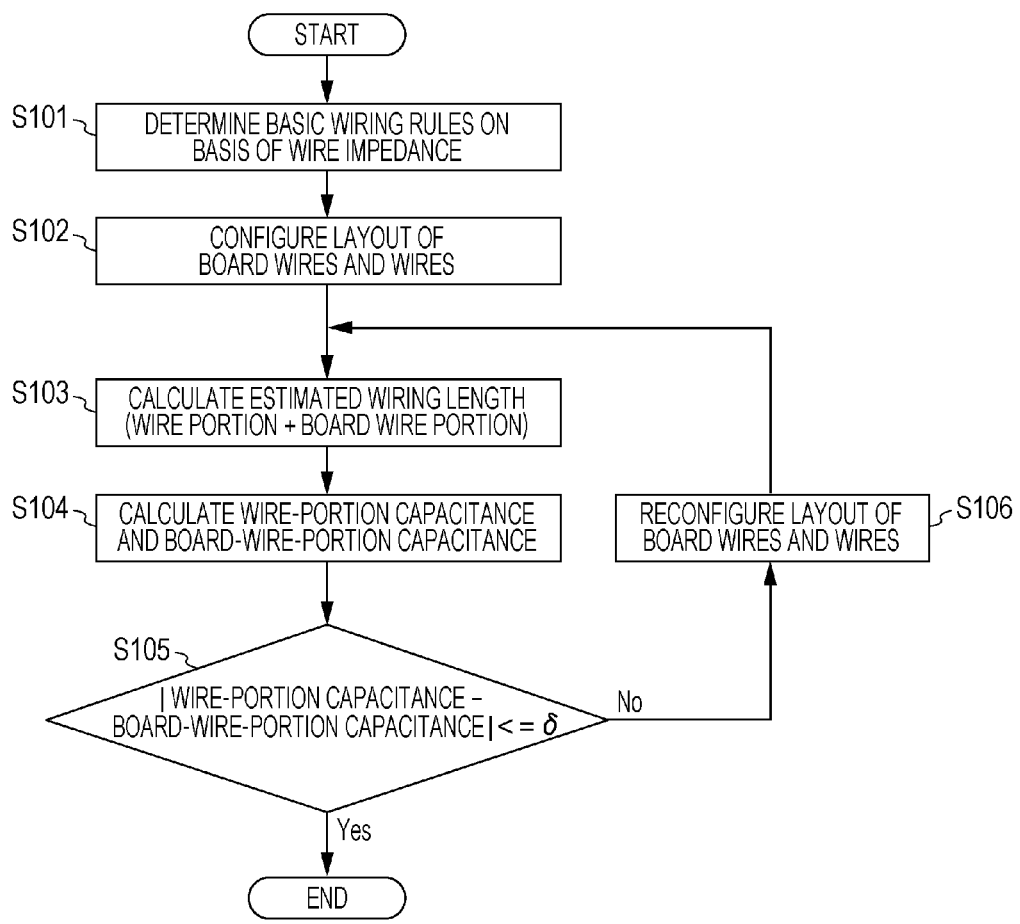
FIG. 5 is an illustration for describing a design method in which a board-wire-portion capacitance is set substantially equal to a wire-portion capacitance.

FIG. 5 is an illustration for describing a design method in which the board-wire-portion capacitance 95 and the board-wire-portion capacitance 96 are respectively set substantially equal to the wire-portion capacitance 97 and the wire-portion capacitance 98.

In step S101, wiring rules for the board wires 40 are determined on the basis of, for example, the impedance characteristics of differential signals.

Then, in step S102, the respective locations (layout) of the board wires 40 and the wires 60 are configured.

Then, in step S103, the length of the board wires 40 and the wires 60 is calculated. Then, in step S104, the board-wire-portion capacitance 95 and the wire-portion capacitance 97 (or the board-wire-portion capacitance 96 and the wire-portion capacitance 98) are calculated.

Subsequently, in step S105, the board-wire-portion capacitance 95 and the wire-portion capacitance 97 (or the board-wire-portion capacitance 96 and the wire-portion capacitance 98) are compared. When the difference between the board-wire-portion capacitance 95 and the wire-portion capacitance 97 (or the board-wire-portion capacitance 96 and the wire-portion capacitance 98) is equal to or less than a predetermined value δ, the design is completed. On the other hand, when the difference between the board-wire-portion capacitance 95 and the wire-portion capacitance 97 (or the board-wire-portion capacitance 96 and the wire-portion capacitance 98) exceeds the predetermined value δ, in step S106, the respective locations of the board wires 40 and the wires 60 are reconfigured. Then, the process returns to step S103 where the length of the board wires 40 and the wires 60 is calculated.

Then, steps S103 to S106 are repeated until the difference between the board-wire-portion capacitance 95 and the wire-portion capacitance 97 (or the board-wire-portion capacitance 96 and the wire-portion capacitance 98) becomes equal to or less than the predetermined value δ in step S105.

In reconfiguration, for example, when the board-wire-portion capacitance 95 is smaller than the wire-portion capacitance 97, the width of the board wire 41a or the board wire 42b is increased, and a distance G1 (refer to FIG. 4) between the signal line pair #1 and the signal line pair #2 is decreased. Moreover, the board wires 40 may be extended. Moreover, the distance between the bond pads 50 and the chip pads 21 may be decreased so as to shorten the wires 60.

On the other hand, when the board-wire-portion capacitance 95 is larger than the wire-portion capacitance 97, it is advised to increase the distance G1 (refer to FIG. 4) between the board wire 41a and the board wire 42b near the board terminals 33. This is because the density of the board wires 40 near the board terminals 33 is lower than that near the bond pads 50, and thus, the distance between the board wires 40 can be readily increased. Moreover, the board wires 40 may be shortened.

Moreover, when the board-wire-portion capacitance 96 is smaller than the wire-portion capacitance 98, the width of the board wire 41b or the board wire 43a is increased, and a distance G2 (refer to FIG. 4) between the board wire 41b and the board wire 43a is decreased. Moreover, the board wires 40 may be extended. Moreover, the distance between the bond pads 50 and the chip pads 21 may be decreased so as to shorten the wires 60.

On the other hand, when the board-wire-portion capacitance 96 is larger than the wire-portion capacitance 98, it is advised to increase the distance G2 (refer to FIG. 4) between the board wire 41b and the board wire 43a near the board terminals 33. Moreover, the board wires 40 may be shortened.

Examples will next be described. Before the description, the amount of crosstalk of signals will be defined.

Figure 6:
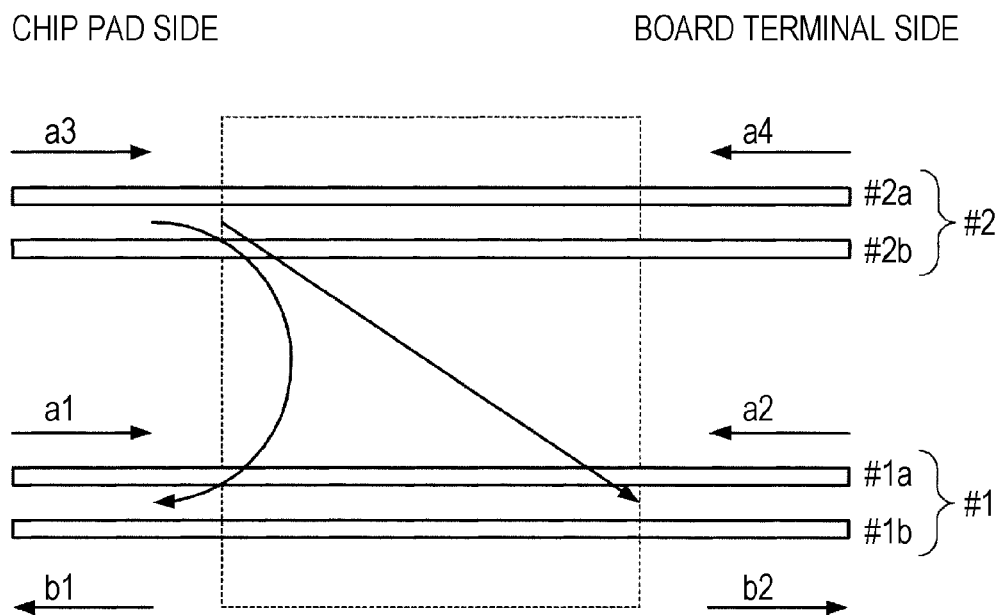
FIG. 6 is an illustration for describing the definition of the amount of crosstalk of signals.

FIG. 6 is an illustration for describing the definition of the amount of crosstalk of signals.

The two signal line pairs #1 and #2 transmitting differential signals are considered. The leakage (crosstalk) of signals from the signal line pair #2 to the signal line pair #1 on the chip pad side of the signal line pair #1 is considered.

Signals with an amplitude a1 are transmitted from the chip pad side, and signals with an amplitude a2 are transmitted from the board terminal side through the signal line pair #1. Moreover, signals with an amplitude a3 are transmitted from the chip pad side, and signals with an amplitude a4 are transmitted from the board terminal side through the signal line pair #2.

In this case, assuming that some of the signals with the amplitude a3 input from the chip pad side of the signal line pair #2 are output, at an amplitude b1, to the chip pad side of the signal line pair #1 due to crosstalk, b1/a3 is the amount of near end crosstalk.

On the other hand, assuming that some of the signals with the amplitude a3 input from the chip pad side of the signal line pair #2 are output, at an amplitude b2, to the board terminal side of the signal line pair #1 due to crosstalk, b2/a3 is the amount of far end crosstalk.

An example and two comparative examples will next be described.

An example is the semiconductor package 10 including the components shown in FIG. 2. In the three signal line pairs, the amount of near end crosstalk and the amount of far end crosstalk were evaluated. The pitch between the chip pads 21 is generally 40 to 100 μm and was set to 60 μm in the example. The pitch between the bond pads 50 is generally 60 to 200 μm and was set to 110 μm in the example. Out of the six bond pads 50, the bond pad 51b is shifted toward the board terminal side. The signal lines #1a and #1b in the signal line pair #1 cross each other. The width of the three signal line pairs was set to 660 μm, considering a pitch of 110 μm for the five bond pads 50 and 110 μm for the shifted bond pad 51b.

The length of the wires 60 connecting the bond pads 50 to the chip pads 21 is generally 2 to 5 mm. In this case, the length of ones of the wires 60 connecting the chip pads 21 to the five bond pads 50 other than the bond pad 51b, out of the six bond pads 50, was set to 2.3 mm. The length of one of the wires 60 connecting the bond pad 51b to one of the chip pads 21 was set to 2.8 mm.

In the example, in the signal line pair #1, the ratio of the area of the region 91 to the area of the region 92 was about 2.0. Moreover, in the signal line pair #1 and the signal line pair #2, the ratio of the board-wire-portion capacitance 95 to the wire-portion capacitance 97 was about 1.0. Moreover, in the signal line pair #1 and the signal line pair #3, the ratio of the board-wire-portion capacitance 96 to the wire-portion capacitance 98 was also about 1.0.

COMPARATIVE EXAMPLE 1

A comparative example 1 will next be described.

Figure 7:
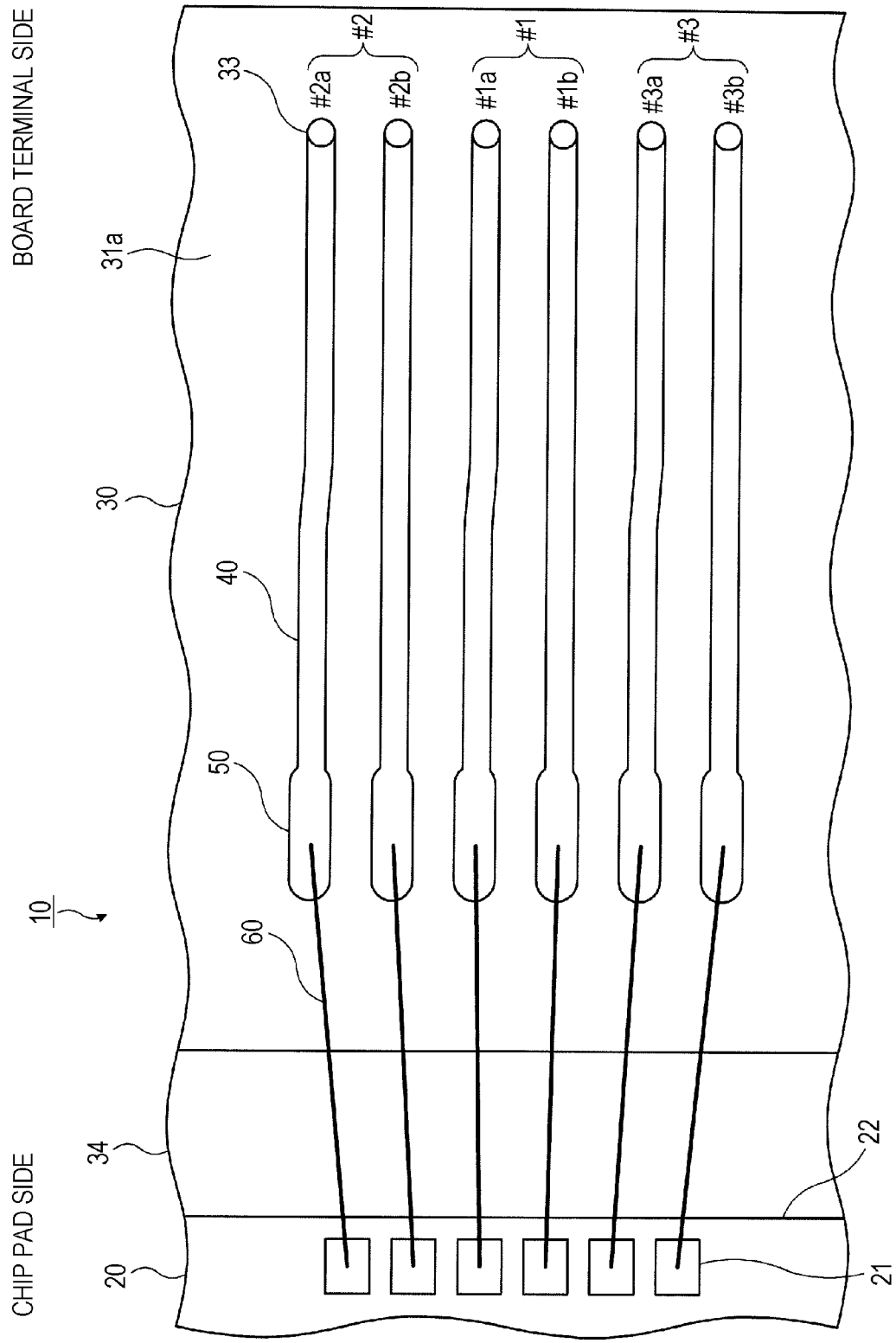
FIG. 7 is a magnified plan view of a portion for describing the semiconductor package of a comparative example 1.

FIG. 7 is a magnified plan view of a portion of the semiconductor package 10 of the comparative example 1. Unlike the example, the six bond pads 50 are disposed in a line. Moreover, all signal lines in the signal line pairs #1 to #3 are disposed so as not to cross each other.

The pitch between the chip pads 21 was set to 60 μm, as in the example. The pitch between the bond pads 50 was set to 110 μm, as in the example. Thus, the width of the three signal line pairs was 660 μm. The width of the three signal line pairs was the same as that in the example. Moreover, the length of the wires 60 was set to 2.3 mm.

COMPARATIVE EXAMPLE 2

A comparative example 2 will next be described.

Figure 8:
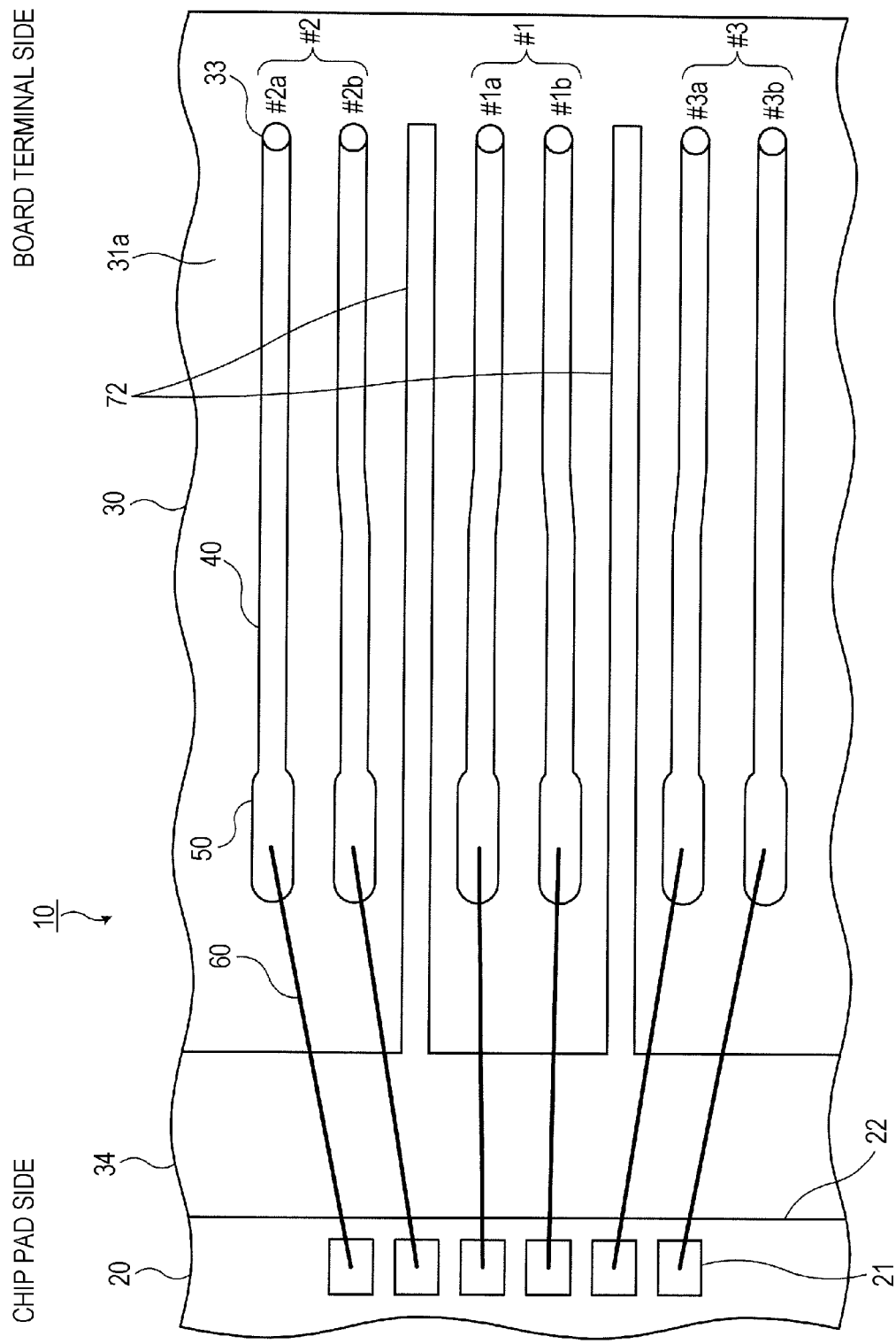
FIG. 8 is a magnified plan view of a portion for describing the semiconductor package of a comparative example 2.

FIG. 8 is a magnified plan view of a portion of the semiconductor package 10 of the comparative example 2. Unlike the example, a shielding wire 72 connected to the ground plate 34 is provided between the three signal line pairs. Moreover, all signal lines are disposed so as not to cross each other.

The pitch between the chip pads 21 was set to 60 μm, as in the example. The pitch between the bond pads 50 was set to 110 μm, as in the example. The width of a portion of the shielding wire 72 was set to 80 μm. Thus, the width of the three signal line pairs was 900 μm. Since the shielding wire 72 is provided, the width of the three signal line pairs is about 1.4 times as large as that in the example. Moreover, the length of the wires 60 was set to 2.3 mm.

FIG. 9 is an illustration showing the amount of near end crosstalk and the amount of far end crosstalk in each of the example, the comparative example 1, and the comparative example 2.

The amount of far end crosstalk at a signal frequency of 1.5 GHz is equal to or less than −50 dB and is sufficiently small in either of the example, the comparative example 1, and the comparative example 2. On the other hand, the amount of near end crosstalk at a signal frequency of 1.5 GHz is −43 dB in the example, −32 dB in the comparative example 1, and −41 dB in the comparative example 2.

In the comparative example 1, the amount of near end crosstalk is equal to or less than −30 dB at a signal frequency of 1.5 GHz. However, the amount of near end crosstalk is large in a high frequency range exceeding 1.5 GHz and is equal to or more than −30 dB at a signal frequency of 2 GHz or more. Thus, in the comparative example 1, the amount of crosstalk is not equal to or less than −30 dB in a signal frequency range of 1 to 3 GHz.

On the other hand, the amount of near end crosstalk in the example is substantially the same as that in the comparative example 2, in which the shielding wire 72 is provided, and is equal to or less than −40 dB at a signal frequency of 1.5 GHz. In the example and the comparative example 2, −30 dB or less is kept until a signal frequency of 3 GHz. That is, in the example and the comparative example 2, the amount of crosstalk is equal to or less than −30 dB in a signal frequency range of 1 to 3 GHz.

The semiconductor package 10 of the example has an advantageous effect of achieving, without including a shielding wire, an amount of crosstalk that is substantially the same as that in the semiconductor package 10 including the shielding wire 72, as described above. Thus, in the semiconductor package 10 of the example, signal degradation can be reduced without decreasing the wiring density of the circuit board 30.

The semiconductor package 10 shown as an example in the embodiment may be sealed with a cover. Moreover, the semiconductor chip 20, the wires 60, the board wires 40, and the like may be sealed with resin. In this case, when the wires 60 cross each other, the wires 60 are prone to come into contact with each other due to the run of resin. In the embodiment, the wires 60 do not cross each other, and thus, an advantageous effect such that the wires 60 are less prone to come into contact with each other is achieved.

While a BGA package board has been shown as an example of the circuit board 30 in the embodiment, the circuit board 30 may be a Pin Grid Array (PGA) package board or a Chip Size Package (CSP) board.

Reference Signs List is provided as follows:
10 semiconductor package
20 semiconductor chip 21 chip pad
30 circuit board
40 board wire
50 bond pad
60 wire

What is claimed is:

1. A semiconductor package comprising:
a semiconductor chip to which one end of each of a plurality of wires is connected; and
a board on which the semiconductor chip is fixed, and a plurality of board wires to which the plurality of corresponding wires are connected are disposed,
wherein the board includes:
a first wiring pair that includes a first pair of wires in parallel with each other and first two board wires connected to the corresponding wires, one of the wires connected to one of the board wires crossing the other board wire without contact with the other board wire, and
a second wiring pair that is provided adjacent to the first wiring pair and includes a second pair of wires in parallel with each other and second two board wires connected to the corresponding wires without a crossing,
wherein, in the first wiring pair and the second wiring pair provided adjacent to the first wiring pair, a ratio between a first capacitance and a second capacitance is equal to or more than 0.5 and equal to or less than 2,
the first capacitance existing between a first portion of a wiring line constituting the first wiring pair, the first portion opposing the second wiring pair on a board wire side, and a second portion of a wiring line constituting the second wiring pair, the second portion being on the board wire side and opposing the first portion,
the second capacitance existing between a third portion of a wiring line constituting the first wiring pair, the third portion opposing the second wiring pair on a wire side, and a fourth portion of the wiring line constituting the second wiring pair, the fourth portion being on the wire side and opposing the third portion.

2. The semiconductor package according to claim 1, wherein, in the first wiring pair, a first wire terminal connected to one of the wires and a second wire terminal connected to the other wire are disposed so as to be shifted from each other at respective different distances from an edge of the semiconductor chip in a direction of the wires.

3. The semiconductor package according to claim 1, wherein the plurality of the wires of the semiconductor chip do not cross each other.

4. The semiconductor package according to claim 1, wherein the first wiring pair and the second wiring pair transmit differential signals.

5. The semiconductor package according to claim 4, wherein differential signals transmitted by the first wiring pair and the second wiring pair have a frequency in a range of 1 to 3 GHz.

6. The semiconductor package according to claim 1, wherein, regarding an area between one wire of the first pair of wires, one board wire of the first two board wires connected to the one wire, the other wire of the first pair of wires, and the other board wire of the first two board wires connected to the other wire,
a ratio between two portions of the area is set equal to or more than 0.5 and equal to or less than 2, the area being divided into the two portions by a perpendicular onto the board with a foot of the perpendicular at a point at which a projection of the one wire connected to the one board wire upon the board crosses the other board wire.

7. A semiconductor package comprising:
a semiconductor chip;
a board on which the semiconductor chip is fixed; and
signal lines each of which includes a wire one end of which is connected to the semiconductor chip and a wiring line that is disposed on the board and connected to the other end of the wire,
wherein the signal lines constitute signal line pairs transmitting differential signals, and a first signal line pair in which signal lines cross each other and a second signal line pair in which signal line do not cross each other are disposed, as the signal line pairs, adjacent to each other so as to cancel signals leaked due to electromagnetic coupling and capacitive coupling between the signal line pairs,
wherein, in the first signal line pair and the second signal line pair provided adjacent to the first signal line pair, a ratio between a first capacitance and a second capacitance is equal to or more than 0.5 and equal to or less than 2,
the first capacitance existing between a first portion of a signal line constituting the first signal line pair, the first portion opposing the second signal line pair on a wiring line side, and a second portion of a signal line constituting the second signal line pair, the second portion being on the wiring line side and opposing the first portion,
the second capacitance existing between a third portion of a signal line constituting the first signal line pair, the third portion opposing the second signal line pair on a wire side, and a fourth portion of the signal line constituting the second signal line pair, the fourth portion being on the wire side and opposing the third portion.

* * * * *